(12) United States Patent
Ploessl et al.

(10) Patent No.: US 8,969,175 B2
(45) Date of Patent: Mar. 3, 2015

(54) METHOD FOR PRODUCING SINGULATED SEMICONDUCTOR DEVICES

(71) Applicant: OSRAM Opto Semiconductors GmbH, Regensburg (DE)

(72) Inventors: Andreas Ploessl, Regensburg (DE); Heribert Zull, Regensburg (DE)

(73) Assignee: OSRAM Opto Semiconductors GmbH, Regensberg (DE)

( * ) Notice: Subject to any disclaimer, the term of this patent is extended or adjusted under 35 U.S.C. 154(b) by 0 days.

(21) Appl. No.: 13/974,991

(22) Filed: Aug. 23, 2013

(65) Prior Publication Data

US 2014/0113390 A1 Apr. 24, 2014

(30) Foreign Application Priority Data

Aug. 24, 2012 (DE) .......................... 10 2012 215 067

(51) Int. Cl.
| | | |
|---|---|---|
| *H01L 21/78* | (2006.01) | |
| *H01L 21/304* | (2006.01) | |
| *H01L 31/18* | (2006.01) | |
| *H01L 21/66* | (2006.01) | |
| *H01L 33/00* | (2010.01) | |
| *H01L 33/20* | (2010.01) | |
| *H01L 31/0687* | (2012.01) | |

(52) U.S. Cl.
CPC ................ *H01L 21/78* (2013.01); *H01L 31/18* (2013.01); *H01L 22/12* (2013.01); *H01L 33/0095* (2013.01); *H01L 33/20* (2013.01); *H01L 31/06875* (2013.01); *H01L 2924/0002* (2013.01)

USPC ....... 438/460; 438/458; 438/33; 257/E21.237

(58) Field of Classification Search
CPC ............................ H01L 21/78; H01L 21/6386
USPC ......................... 438/33, 59, 68, 113, 459, 460
See application file for complete search history.

(56) References Cited

U.S. PATENT DOCUMENTS

| | | | | |
|---|---|---|---|---|
| 4,978,639 A | * | 12/1990 | Hua et al. ....................... | 438/465 |
| 5,185,292 A | * | 2/1993 | VanVonno et al. .............. | 438/59 |
| 5,223,914 A | * | 6/1993 | Auda et al. ..................... | 356/630 |
| 5,824,595 A | * | 10/1998 | Igel et al. ....................... | 438/464 |
| 7,825,008 B2 | * | 11/2010 | Ikeda et al. .................... | 438/460 |
| 2008/0220206 A1 | * | 9/2008 | Wang et al. .................... | 428/118 |

(Continued)

FOREIGN PATENT DOCUMENTS

| | | |
|---|---|---|
| DE | 4123228 A1 | 1/1993 |
| DE | 10327612 A1 | 11/2004 |

(Continued)

*Primary Examiner* — Selim Ahmed
*Assistant Examiner* — Changhyun Yi
(74) *Attorney, Agent, or Firm* — Slater & Matsil, L.L.P.

(57) ABSTRACT

A method for producing singulated semiconductor components includes providing a starting substrate. An etching process is carried out to form depressions at a side of the starting substrate. The depressions are arranged in the region of the semiconductor components to be produced. Walls present between the depressions are arranged in the region of separating regions provided for severing the starting substrate. The method furthermore comprises forming a metallic layer on the side of the starting substrate with the depressions and walls and carrying out a further etching process for severing the starting substrate in the separating regions and forming the singulated semiconductor components.

13 Claims, 9 Drawing Sheets

(56) References Cited

U.S. PATENT DOCUMENTS

2008/0315220 A1 12/2008 Lee et al.
2009/0159126 A1* 6/2009 Chan .............................. 136/259

FOREIGN PATENT DOCUMENTS

| | | |
|---|---|---|
| DE | 102008008920 A1 | 8/2008 |
| WO | 2009028895 A2 | 3/2009 |

* cited by examiner

METHOD FOR PRODUCING SINGULATED SEMICONDUCTOR DEVICES

This application claims priority to German Patent Application 10 2012 215 067.6, which was filed Aug. 24, 2012 and is incorporated herein by reference.

TECHNICAL FIELD

The invention relates to a method for producing singulated semiconductor components.

BACKGROUND

Semiconductor components are typically formed jointly on a wafer-type semiconductor substrate having a stable thickness. The semiconductor wafer is furthermore thinned and severed in predefined separating regions, as a result of which individual components are present. For components having both front-side and rear-side contacts, for example, luminescence diode chips, a metal-semiconductor contact is formed at a rear side of the semiconductor wafer after thinning.

For singulation it is possible to carry out sawing or separation by grinding, or laser cutting. However, such separating processes can lead to crystal damage, which is associated with a risk of breaking in the case of relatively thin components or chips. In order to avoid this and in order to produce chips that are more stable, provision can be made for etching separating trenches. In this regard, anisotropic dry etching processes afford sufficiently high etching rates on semiconductor materials. What is problematic however, is the severing of metallic layers, for which dry or plasma etching is unsuitable.

One possible approach consists in processing a semiconductor substrate as usual, preparing the front side in the separating regions to be free of metal, thinning the substrate, providing the rear side with a metal-semiconductor contact (and possible further layers), and mounting with the rear side onto a film. Afterward, separating trenches can be produced from the front side in an anisotropic etching process, wherein the trench etching can stop on the metallic contact layer at the rear side. The singulation can be completed by carrying out wet-chemical etching of the rear-side metal or tearing the latter by expanding the film. However, this results in an unstable manufacturing process.

Alternatively, provision can be made for photolithographically patterning the metal layer before the separating trenches are etched. However, this requires complex front to rear side alignment and, owing to the presence of the thin semiconductor substrate, can result in the latter breaking. In order to avoid this, consideration can be given to connecting the semiconductor substrate to a stabilizing auxiliary substrate. This approach increases the outlay, and can likewise lead to losses of yield when the auxiliary substrate is removed.

SUMMARY OF THE INVENTION

Embodiments of the present invention specify an improved method for producing singulated semiconductor components.

In accordance with one aspect of the invention, a method for producing singulated semiconductor components is proposed. The method comprises providing a starting substrate, and carrying out an etching process for forming depressions at a side of the starting substrate. The depressions are arranged in the region of the semiconductor components to be produced. Walls present between the depressions are arranged in the region of separating regions provided for severing the starting substrate. The method furthermore comprises forming a metallic layer on the side of the starting substrate with the depressions and walls, and carrying out a further etching process for severing the starting substrate in the separating regions and forming the singulated semiconductor components.

Instead of thinning a substrate at an entire side and subsequently severing it, as is the case in conventional singulation methods, the method involves forming depressions in the starting substrate before severing, said depressions being arranged in the region of the semiconductor components to be produced. The depressions are therefore situated at those regions of the starting substrate from which (subsequently) the individual components emerge. The separating regions for severing the starting substrate are provided between these substrate regions. As a result of forming the depressions, it is possible for the starting substrate to be thinned to a final thickness provided for the semiconductor components. Substrate material that has remained in this method stage in the form of the walls which extend between the depressions or separate the depressions from one another ensures that the partly thinned starting substrate can still have a relatively high stability. This benefits processes such as the subsequent formation of the metallic layer and the severing of the starting substrate in the predefined separating regions, said severing being carried out for the purpose of singulation.

In the method, etching processes are used to form the depressions and to carry out the (actual) severing of the starting substrate. In this way, the singulation can be effected without mechanical stress (crystal damage) of the semiconductor components, as a result of which the semiconductor components can have a high stability. As a result, it is furthermore possible to form the semiconductor components with a relatively small thickness. The method can furthermore be carried out in a cost-effective manner and without employing an expensive auxiliary substrate for stabilization.

In accordance with one embodiment, provision is made for the starting substrate to be a coated carrier substrate composed of a semiconductor material. The carrier substrate has a layer arrangement arranged at a first side. The depressions are formed at a second side of the carrier substrate, said second side being opposite the first side. The layer arrangement can comprise a component layer or useful layer suitable for the components to be produced, for example, having a semiconductor layer sequence. If appropriate, the layer arrangement can furthermore comprise an intermediate layer present between the useful layer and the carrier substrate.

Such an embodiment comprising a coated carrier substrate may be appropriate, for example, for the production of optoelectronic semiconductor components. These include luminescence diodes, for example. For components of this type, the layer arrangement arranged on the carrier substrate comprises a useful layer for luminescence diodes.

In an alternative embodiment, the layer arrangement comprises a useful layer for concentrator solar cells in order to be able to produce such solar cells.

In the case of luminescence diodes and in the case of concentrator solar cells, the associated useful layer can be present in the form of a semiconductor layer sequence which is produced on an epitaxy substrate with the aid of an epitaxy method and is subsequently applied or transferred to the carrier substrate. Further processes (for example, forming further layers on the useful layer, patterning processes) can be carried out before the layer transfer. Afterward, the epitaxy substrate can be removed or eroded.

For semiconductor components, for example, luminescence diodes, the abovementioned small thickness that can be achieved with the aid of the production method enables the presence of a low thermal resistance between the layer arrangement (comprising an electronically or optoelectronically used active component layer) arranged in the region of the first side of the carrier substrate and the opposite second side of the carrier substrate. As a result, relatively good heat dissipation can be achieved, as a result of which it is possible to operate the components with higher power for the same efficiency in comparison with thicker components.

In a further embodiment, the method furthermore comprises patterning the layer arrangement arranged on the first side of the carrier substrate into individual layer sections. The layer sections are arranged (like the depressions at the second side of the carrier substrate) in the region of the semiconductor components to be produced. Cutouts present between the layer sections are arranged (like the walls at the second side) in the region of the separating regions provided for severing. In this embodiment, the separate layer sections can constitute pre-patterned components which are (still) connected to one another via the carrier substrate. After the patterning of the layer arrangement, the first side of the carrier substrate in the cutouts between the layer sections can be uncoated or exposed, as a result of which the etching process provided for severing the substrate can be made possible or fostered.

The patterning of the layer arrangement into the separate layer sections can be effected, for example, before the etching process for forming the depressions is carried out. These two processes carried out at the opposite sides of the substrate (and their local coordination or alignment with respect to one another) can be carried out on the carrier substrate having (still) a relatively large thickness. In this way, it is possible to reliably avoid the risk of the substrate breaking.

In a further embodiment, the metallic layer is formed on the substrate side with the depressions and walls in such a way that side regions of the walls are exposed. In this embodiment, the metallic layer can be formed in sections in regions separated from one another, i.e., in the region of the depressions and on the walls in the region of the ends thereof. Sections of the metallic layer in the region of the depressions can form corresponding contacts or rear-side contacts in the (subsequently singulated) semiconductor components. As a result of such patterned formation of the metallic layer, which can be fostered, for example, by directional application (for example, vapor deposition), it is possible to avoid a separating step for severing the metallic layer.

In a further embodiment, the method comprises removing the walls present between the depressions. An etching process, for example, can be carried out for this purpose.

It is possible for this to involve the etching process carried out for severing the starting or carrier substrate, i.e., for the removal of the walls and the severing to be able to take place in a common etching process. In this way, the production method can be carried out relatively rapidly and with a relatively low outlay.

However, it is also possible to carry out separate etching processes, wherein the removal of the walls is carried out before the severing of the substrate. In this way, it is possible to ensure, for example, that the removal of the walls cannot result in impairment of the severing (for example, as a result of detached material of the metallic layer).

For removing the walls with the aid of an etching process, the above-described formation of the metallic layer according to which side regions of the walls are exposed can prove to be advantageous. This makes it possible that an etching attack can be effected via the uncoated side regions of the walls, as a result of which the walls together with that part of the metallic layer which is situated thereon can be removed.

In a further embodiment, provision is made for carrying out the removal of the walls (before the substrate is severed) with the aid of a polishing or grinding process. A part of the metallic layer that is situated on the walls can be concomitantly removed during polishing.

It is possible to carry out, instead of complete removal, only partial removal of the walls, including a part of the metallic layer that is arranged thereon, by etching or polishing. By way of example, the walls can be partly eroded by polishing in order to prepare the walls for faster removal by etching that is carried out subsequently.

In a further embodiment, a part of the metallic layer that is formed on the walls is removed. What can be achieved as a result is that it is possible to avoid impairment of a subsequent process by a metal mask present in this region. Such a subsequent process is, for example, the removal of the walls and/or the severing of the substrate.

By way of example, a lift-off process may be appropriate for removing that part of the metallic layer which is formed on the walls. In such a process, a patterned etching or photoresist mask used for forming the depressions can be employed, which is (initially) not removed, such that the metallic layer in the region of the walls is arranged thereon. By dissolving the mask, for example, by employing a solvent, it is possible for that part of the metallic layer which is situated on the walls to be lifted off.

Instead of a lift-off process, the removal of the metallic layer present in the region of the walls can, as indicated above, also be carried out together with the (if appropriate only partial) removal of the walls (by etching or polishing).

In the singulated semiconductor components, the metallic layer can be used both for mechanical connection and for making electrical contact with mating contacts (for example, of a carrier, a circuit board, a housing, a package, etc.). In this case, the metallic layer can serve as a rear-side contact layer of the semiconductor components. With regard to luminescence diodes, the metallic layer can be embodied, for example, in the form of a stack comprising a metal/semiconductor contact and further metallic partial layers. The semiconductor components can accordingly be formed in each case with an associated front-side contact. Alternatively, it is possible for the metallic layer to be used only for producing mechanical contacts and thus for mechanical connection, and in this sense to serve for example only as a rear-side solder layer. In such a configuration, the semiconductor components can be formed only with electrical front-side contacts.

The semiconductor components can furthermore be formed with a customary rectangular or square contour. Owing to the use of etching processes, the production method furthermore affords the possibility of deviating from the rectangular geometry and providing other lateral shapes which afford for example the advantage of better area utilization. One geometry that is appropriate in this regard is a hexagonal shape. In a further embodiment, provision is accordingly made for forming the depressions in the region of the semiconductor components to be produced with a hexagonal shape. This can likewise apply to the layer sections formed from the layer arrangement (on the other side of the substrate).

In a further embodiment, the etching process for forming the depressions and the etching process for severing the starting substrate in each case comprise anisotropic dry etching. As a result, the relevant etching processes can be carried out with a relatively high speed and accuracy. By way of example, a deep reactive ion etching process can be carried out in each case.

In a further embodiment, the etching process for forming the depressions is monitored with the aid of an interferometric measurement. In this way, the erosion depth and thus the final thickness that is provided for the semiconductor components and is dependent on said depth can be set with a high accuracy.

This applies in the same way to a further embodiment, according to which the etching process for forming the depressions is carried out in a time-monitored manner.

The method and its embodiments can also be employed for producing components other than luminescence diodes or concentrator solar cells. One possible example is the production of laser diodes. In this case, the starting substrate can be a coated carrier substrate having, at a first side, a layer arrangement comprising a component layer or useful layer for laser diodes.

A further example is the production of silicon components, for example, integrated circuits. In this case, the starting substrate can be a carrier substrate having, at a first side, corresponding components, i.e., electrical and/or electronic structures, circuit structures, contacts, etc. The depressions and the metallic layer can be formed at an opposite second side of the substrate.

The advantageous embodiments and developments of the invention explained above and/or reproduced in the dependent claims can be employed—apart from, for example, in the cases of unambiguous dependencies or incompatible alternatives—individually or else in any desired combination with one another.

BRIEF DESCRIPTION OF THE DRAWINGS

The above-described properties, features and advantages of this invention and the way in which they are achieved will become clearer and more clearly understandable in association with the following description of exemplary embodiments which are explained in greater detail in association with the schematic drawings, in which.

DETAILED DESCRIPTION OF ILLUSTRATIVE EMBODIMENTS

Figure 1:
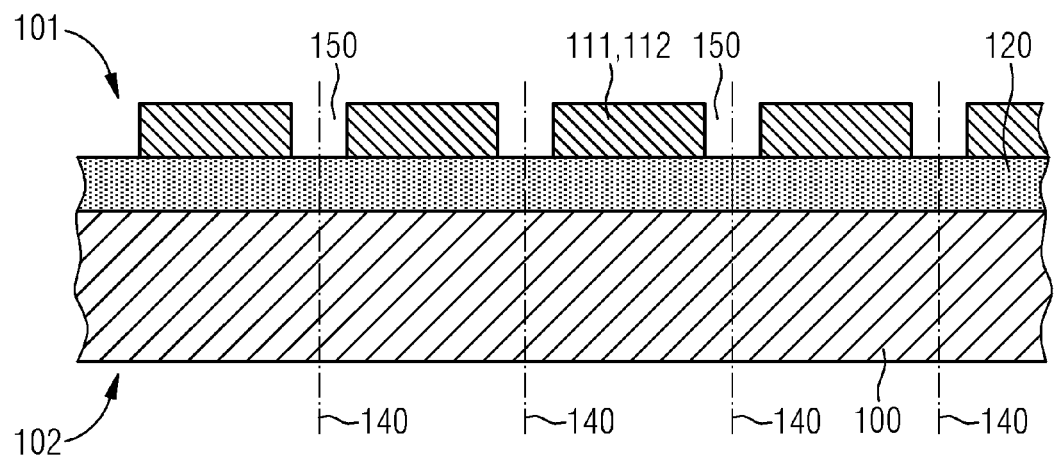
FIG. 1 shows a substrate with an arrangement comprising a patterned useful layer and an intermediate layer at a front side of the substrate.

Embodiments of a method for producing singulated semiconductor components having a metallic layer arranged at a rear side are described on the basis of the following figures. The method can be carried out in a relatively cost-effective and rapid manner. Furthermore, mechanically stable components having a relatively small thickness can be produced with a high manufacturing yield.

The production method can be employed for manufacturing luminescence diodes 191 (LED, Light Emitting Diode), including infrared emitting diodes (IRED), or concentrator solar cells 192, as will be described in greater detail below. In the method, processes known in semiconductor technology, in particular in the manufacturing of luminescence diodes and concentrator solar cells, can be carried out and customary materials can be used, and so these will be discussed only in part. It is furthermore pointed out that besides the processes illustrated and described, if appropriate, further method steps can be carried out in order to complete the production of the respective components. In the same way, the components can comprise further structures and structure elements besides structures shown and described.

Firstly, the production of luminescence diodes or LED chips 191 will be described with reference to FIGS. 1 to 16. Method steps carried out in the method are supplementarily summarized in the flow chart in FIG. 17, to which reference is likewise made below.

In the method, a step 201 (cf. FIG. 17) involves providing a wafer-type carrier substrate 100 serving as starting substrate, at the front side 101 of which a layer arrangement for the LED chips 191 to be produced is arranged. The coated carrier substrate 100 comprises a (doped) semiconductor material, for example, silicon or germanium. The layer arrangement substantially comprises a useful layer 111 produced by thin-film technology and an associated intermediate layer 120 (cf. FIG. 1). The useful layer 111 and the intermediate layer 120 are constructed from a plurality of (if appropriately patterned) partial layers (not illustrated).

The useful layer 111 comprises a semiconductor layer sequence having an active zone suitable for emitting radiation, which is grown on an epitaxy substrate (not illustrated) with the aid of an epitaxy method and is transferred to the carrier substrate 100 serving as replacement carrier. The active zone can have, for example, a pn junction, a double heterostructure, a single quantum well structure, a multiple quantum well structure and/or a quantum cascade structure for generating radiation. The useful layer 111 can be based, for example, on a III/V compound semiconductor material, for example, AlGaInN or GaN.

Further processes are carried out before the layer transfer. They include forming further layers on the useful layer 111, in particular metallic layers—for example, a buried mirror or mirror contact layer, a metal/semiconductor contact layer, a metallic connecting layer used for mounting onto the carrier substrate 100, or a plurality of such layers—and if appropriate one (or more) insulating barrier layer(s). The intermediate layer 120 shown in the figures comprises such (partial) layers.

Individual layers of the intermediate layer 120 and the useful layer 111 can be additionally patterned, if appropriate.

The carrier substrate 100, too, can be provided with a metallic connecting layer at the front side 101 for the layer transfer. A bonding method is subsequently carried out in order to arrange the coated epitaxy substrate on the carrier substrate 100. In the context of the bonding method, by way of example, the connecting layers can be melted, such that they form a common connecting layer. In the composite produced in this way, the useful layer 111 and the intermediate layer 120 (which comprises the common connecting layer) are arranged between the carrier substrate 100 and the epitaxy substrate. Afterward, the epitaxy substrate is removed from the useful layer 111 or eroded from the latter. For this purpose, depending on the material of the epitaxy substrate, it is possible to carry out processes such as, for example, a laser lift-off process or wet-chemical etching of the epitaxy substrate.

The thin-film useful layer 111 exposed on the front side by the removal of the epitaxy substrate can furthermore be roughened at the surface, or be provided with a surface patterning (not illustrated). In this way, improved coupling-out of radiation can be made possible during the operation of the LED chips 191. For this purpose, it is possible to carry out, for example, a suitable etching process, for example, etching using potassium hydroxide.

In the context of step 201 (cf. FIG. 17), the layer arrangement comprising useful layer 111 and intermediate layer 120 present at the front side 101 of the carrier substrate 100 is furthermore patterned. For this purpose, firstly, as shown in FIG. 1, the useful layer 111 is subdivided by etching into individual sections associated with the LED chips 191 to be produced. The sections of the useful layer 111 are separated from one another by cutouts 150 which surround the individual sections of the useful layer 111 and which together form a common cutout structure or trench structure (also cf. FIG. 3). The cutouts 150 are arranged in the region of separating regions 140, which are indicated by broken lines in FIG. 1 and in which the carrier substrate 100 is severed in a later method stage for the purpose of singulation. The patterning of the useful layer 111 can be effected (not illustrated), for example, by dry or plasma etching using an etching mask formed on the useful layer 111, for example, a photoresist mask or a hard mask.

Figure 2:
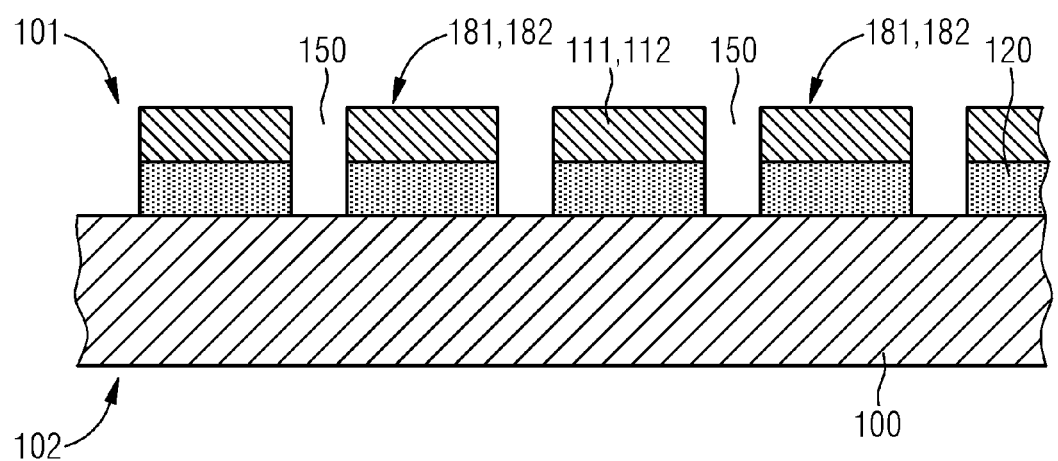
FIG. 2 shows the substrate after the intermediate layer has been patterned as a result of which separate layer sections are present for semiconductor components to be produced.
Figure 3:
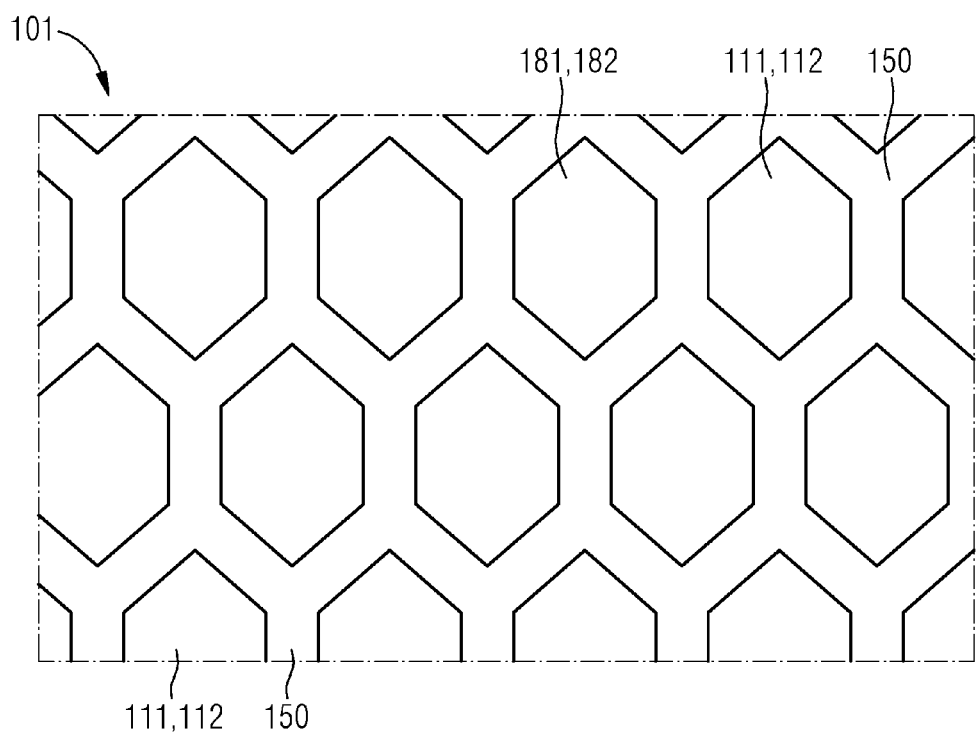
FIG. 3 shows a plan view illustration of the front side of the substrate.

In step 201 (cf. FIG. 17), furthermore, as shown in FIG. 2, the layers combined in the intermediate layer 120 are removed in the separating regions 140, as a result of which the cutouts 150 extend as far as the carrier substrate 100 and the front side 101 of the carrier substrate 100 is locally exposed in the region of the separating regions 140. The patterning of the intermediate layer 120 can be effected by wet-chemical etching, for example. After the local removal of the intermediate layer 120, individual layer sections 181 formed from the useful layer 111 and the intermediate layer 120 are present in the region of the LED chips 191 to be produced. The layer sections 181 which are separated from one another by the cutouts 150 present in the separating regions 140 constitute pre-patterned LED components which are still connected to one another via the carrier substrate 100.

As described in greater detail further below, the singulation is carried out on the basis of etching processes. This affords the possibility of forming the LED chips 191 with a shape that deviates from a conventional rectangular or square shape. In the present exemplary embodiment described, a hexagonal shape is provided, as a result of which the production of the chips 191 that emerge from the coated carrier substrate 100 can be achieved with a better area utilization. With regard to hexagonal LED chips 191, the individual layer sections 181 are already produced with such a hexagonal shape, as becomes clear from the front side 101 of the carrier substrate 100 as shown in the plan view in FIG. 3. The shown structure comprising the layer sections 181 and the continuous cutouts 150 enclosing the layer sections 181 is similar to a honeycomb pattern.

The layer sections 181 assigned to the LED chips 191 are furthermore formed with front-side contacts, which can be used to make contact with the useful layer 111. The front-side contacts can be formed, for example, before the patterning of the layer arrangement 111, 120 into the separate layer sections 181, or else, for example, in the context of patterning, i.e., after the patterning of the useful layer 111 and before the patterning of the intermediate layer 120. Possible configurations which may apply in each case to all layer sections 181 arranged on the carrier substrate 100 are described in greater detail below.

Figure 4:
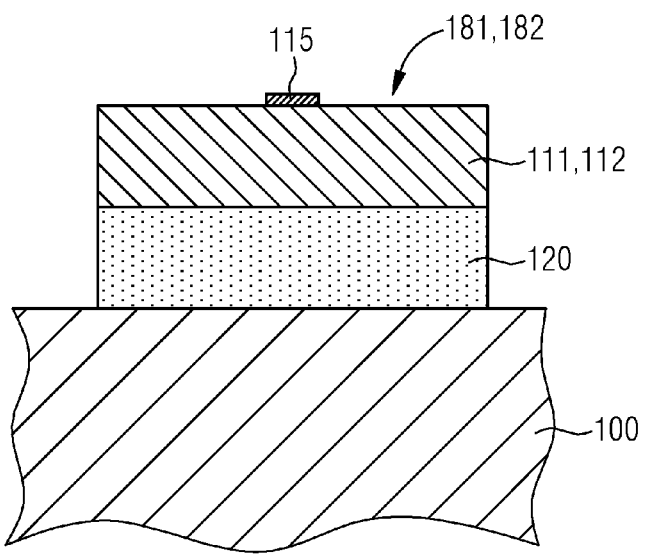
FIGS. 4 to 8 show possible embodiments of the layer sections for the components with different front-side contacts.

FIG. 4 shows a layer section 181 with a front-side contact 115 arranged on the front side on the useful layer 111. The front-side contact 115 can be formed, for example, for making contact by means of wire bonding. For this purpose, the front-side contact 115 can be formed in a multilayered fashion or in the form of a stack of functional layers. One possible example is a stack comprising Ti/Pt/Au, with Ti for forming a metal-semiconductor contact with the useful layer 111, Pt as a barrier for preventing titanium-gold interactions, and Au as an inert connection area for wire contact-making. A further possible configuration is a combination of transparent conductive oxide and metallic layers.

By means of the front-side contact 115, it is possible to make contact with the useful layer 111 (or a front-side partial layer thereof, for example, n-type layer) of the layer section 181 shown from the front side. Contact can be made with the rear side of the useful layer 111 (or a rear-side partial layer, for example, a p-type layer) in the later LED chip 191 by means of a rear-side contact arranged on the carrier substrate 100, the carrier substrate 100 (i.e., the doped semiconductor material thereof) and the intermediate layer 120 (cf. FIG. 13 with the layer 130 serving as rear-side contact).

In a further configuration (not illustrated), additional linear contact structures connected to the front-side contact 115 can be arranged on the useful layer 111. Furthermore, the contact 115, provided for wire bonding, for example, can be arranged at the edge of the useful layer 111.

Figure 5:
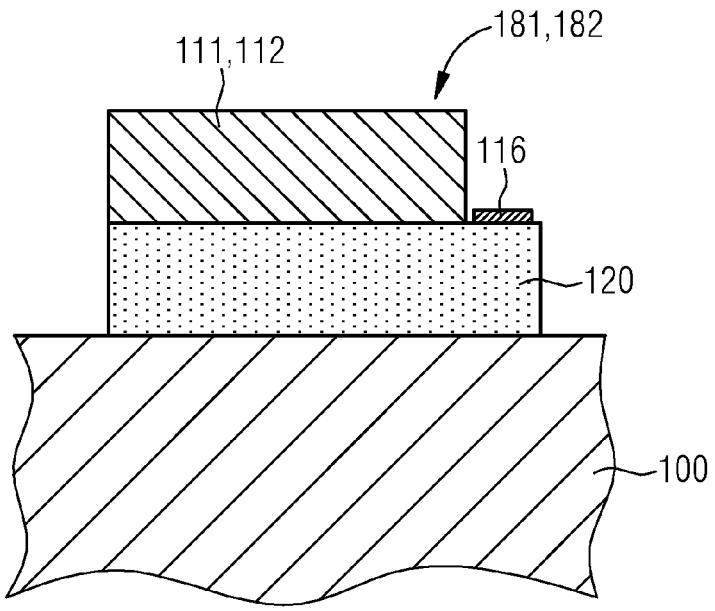

FIG. 5 shows a further variant, wherein a front-side contact 116 is arranged on the intermediate layer 120 laterally with respect to the useful layer 111. In comparison with FIG. 4, the layer section 181 therefore has a stepped shape at this location. As a result of the lateral contact 116, no shading of the front side of the useful layer 111 occurs. The front-side contact 116 can likewise be formed, for example, for making contact by means of wire bonding and, for example, (like the contact 115 described above) in a multilayered fashion.

In the case of the layer section 181 from FIG. 5, provision can be made, for example, for the front-side contact 116 to be electrically connected to the rear side of the useful layer 111 (or to a rear-side partial layer thereof, for example, p-type layer) via a conductive structure (in particular mirror contact layer) of the intermediate layer 120. For making contact with the front side of the useful layer 111 (or a front-side partial layer, for example, an n-type layer), the intermediate layer 120 can have one or more insulated through-contacts (not illustrated) which project into the useful layer 111 and partly penetrate through the useful layer 111. In this way, in the case of the LED chip 191, contact can be made with the front side of the useful layer 111 (or the front-side partial layer) via a rear-side contact, the carrier substrate 100 and the intermediate layer 120 (cf. FIG. 13 with the layer 130 serving as rear-side contact).

Alternatively, an opposite configuration is conceivable, according to which the front-side contact 116 is connected to the front side of the useful layer 111 (or the front-side partial layer) and the rear-side contact is connected to the rear side of the useful layer 111 (or the rear-side partial layer). This can likewise be realized on the basis of corresponding structures and one or more through-contacts.

Figure 6:
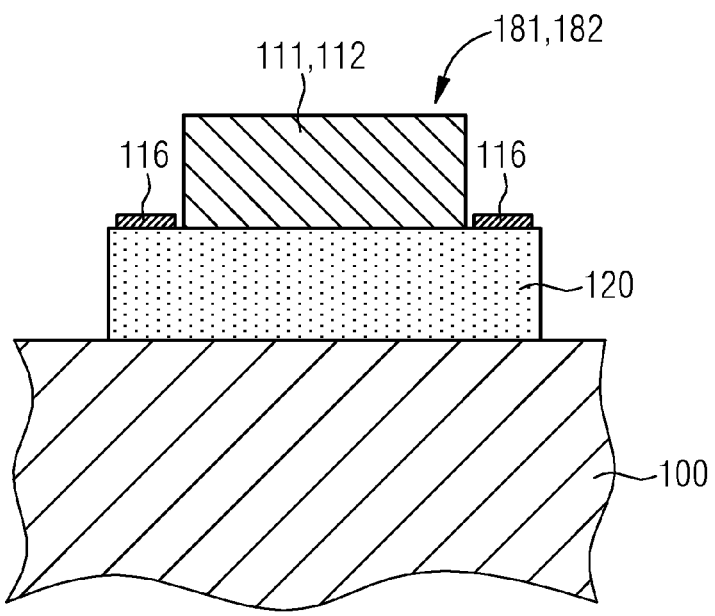

FIG. 6 shows a further configuration, wherein two front-side contacts 116 suitable for wire bonding, for example, are arranged on the intermediate layer 120 laterally with respect to the useful layer 111. The layer section 181 therefore has a stepped shape in each case in the region of the two contacts 116. In this configuration too, no shading of the front side of the useful layer 111 occurs.

In the case of the layer section 181 from FIG. 6, one of the two front-side contacts 116 is electrically connected to the front side of the useful layer 111 (or to a front-side partial layer, for example, n-type layer), whereas the other front-side contact 116 is connected to the rear side of the useful layer 111 (or to a rear-side partial layer, for example, p-type layer). For this purpose, the intermediate layer 120 is formed (not illustrated) with corresponding conductive structures and with one or more through-contacts partly penetrating through the useful layer 111.

Figure 7:
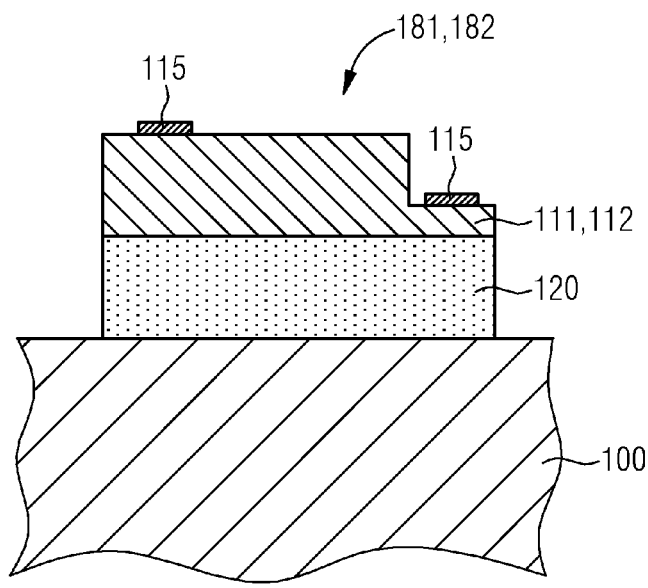

FIG. 7 shows a further configuration of a layer section 181, wherein two front-side contacts 115, which can be formed for making contact by means of wire bonding, for example, are arranged on the useful layer 111. The useful layer 111 has a stepped shape, such that a rear-side partial layer (for example, p-type layer) of the useful layer 111 is accessible at the edge thereof (right-hand side of the useful layer 111 in FIG. 7). In this region, one front-side contact 115 is arranged on the accessible rear-side partial layer. The other front-side contact 115 (on the left in FIG. 7) is arranged, by contrast, on a front-side partial layer of the useful layer 111 (for example, n-type layer).

Figure 8:
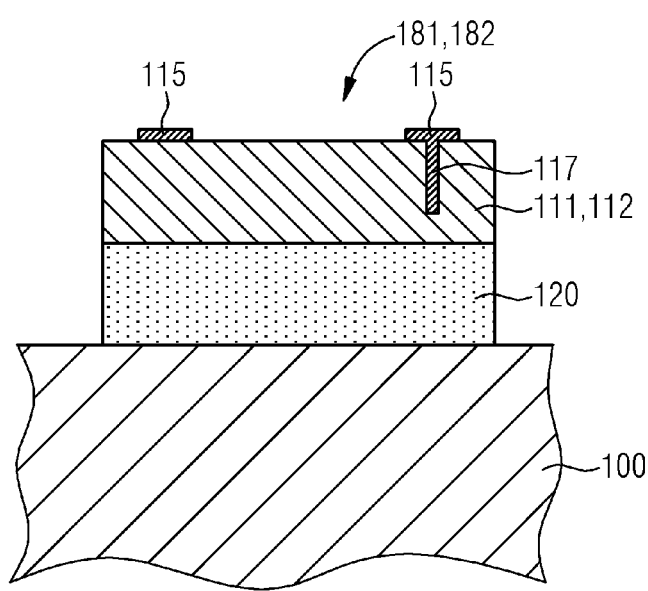

FIG. 8 shows a further configuration of a layer section 181, wherein two front-side contacts 115, which can be formed for making contact by means of wire bonding, for example, are arranged on the useful layer 111. One front-side contact 115 (on the left in FIG. 8) is electrically connected to a front-side partial layer of the useful layer 111 (for example, an n-type layer). The other front-side contact 115 (on the right in FIG. 8) is connected to a rear-side partial layer of the useful layer 111 (for example, a p-type layer) via a through-contact 117.

In the embodiments in FIGS. 6, 7 and 8, a metallic layer (cf. FIG. 13 with the layer 130) present on the rear side on the carrier substrate 100 in the later LED chip 191 can be used only for producing a mechanical contact. Furthermore, provision can be made for the intermediate layer 120 to comprise an electrical insulation layer, whereby the useful layer 111 can in each case be electrically insulated from the carrier substrate 100.

Figure 9:
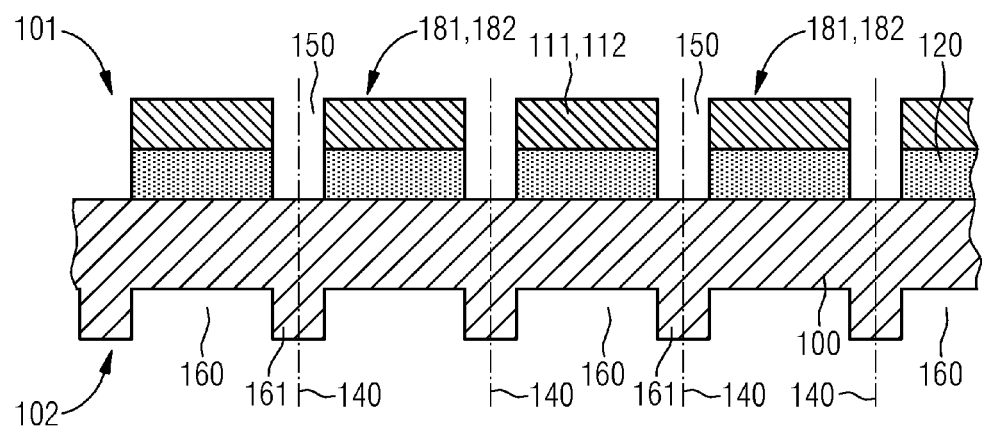
FIG. 9 shows the substrate after the production of depressions at a rear side of the substrate, wherein the depressions are separated from one another by web-shaped walls.

The carrier substrate 100 with the front-side layer sections 181 formed according to FIG. 4, 5, 6, 7 or 8 is subsequently subjected to a step 202 (cf. FIG. 17), in which, as shown in FIG. 9, individual depressions 160 are formed at a rear side 102 of the carrier substrate 100, said rear side being opposite the front side 101. The depressions 160 are in each case situated below the layer sections 181, and like the layer sections 181 are arranged in the region of the LED chips 191 to be produced. The depressions 160 are consequently situated at those regions of the carrier substrate 100 from which the individual LED chips 191 emerge later. With regard to the above-described hexagonal shape of the LED chips 191, the depressions 160 are also formed with such a shape. This configuration is illustrated in FIG. 10, which shows the rear side 102 of the substrate 100 in plan view.

Figure 10:
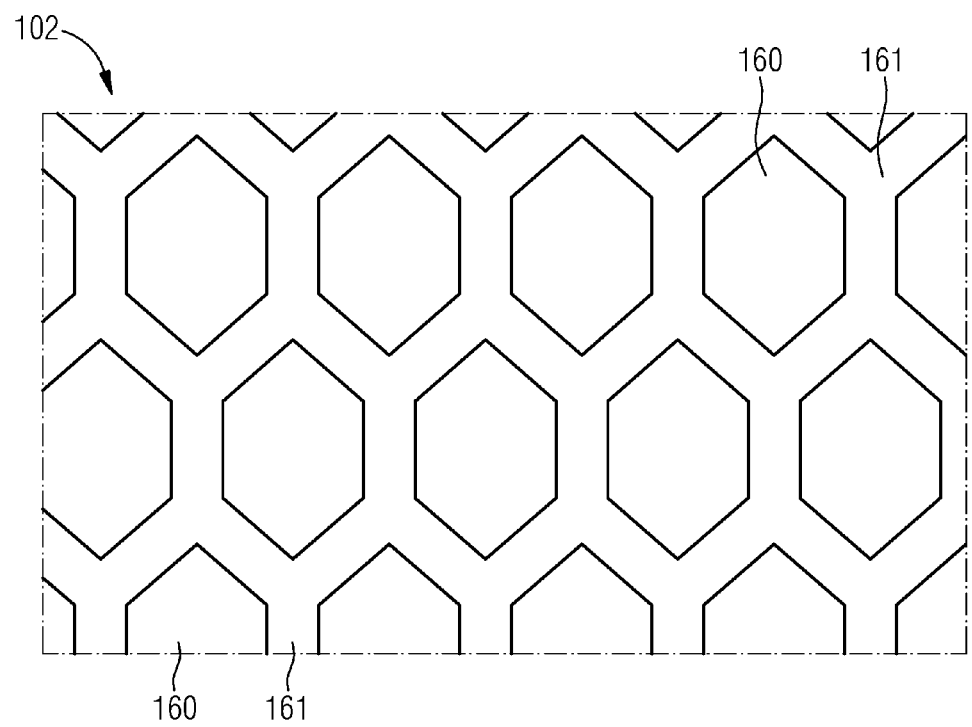
FIG. 10 shows a plan view illustration of the rear side of the substrate.

As it becomes more clear with reference to FIGS. 9 and 10, web-shaped walls 161 are situated between the depressions 160 and separate the depressions 160 from one another. The walls 161, which are arranged below the front-side cutouts 150 and therefore in the region of the separating regions 140 provided for severing the substrate (cf. FIG. 9), are present in the form of a continuous wall structure. The depressions 160 and the walls 161 surrounding the depressions 160 form a structure similar to a honeycomb pattern which is congruent or substantially congruent with the honeycomb pattern (comprising the layer sections 181 and trenches 150) present at the front side 101 of the carrier substrate 100.

The formation of the depressions 160 and "honeycomb walls" 161 at the rear side 102 of the carrier substrate 100, which can be equated with transferring the front-side honeycomb pattern to the rear side 102 of the substrate 100, is carried out with the aid of an anisotropic dry etching process using an etching mask formed on the rear side 102, for example, in the form of a patterned photoresist layer or a patterned hard mask layer (not illustrated). In this way, the depressions 160 can be formed with the desired hexagonal shape relatively rapidly and with a high reliability and accuracy. During the dry etching process, the depressions 160 are etched into the rear side 102 of the carrier substrate 100, whereas substrate material that is masked and as a result not etched remains in the form of the thin walls 161.

It is appropriate to carry out a deep reactive ion etching (DRIE) process, in which an etching step and a passivation step are cyclically repeated. Furthermore, a plasma is generated in the deep ion etching process, for example, by inductive coupling (ICP-RIE, Inductively Coupled Plasma Reactive Ion Etching). For the case of a carrier substrate 100 composed of silicon, an alternating supply of SF6 for etching and C4F8 for forming a polymer passivation layer can be provided, for example, on the basis of the so-called Bosch process.

As a result of the formation of the rear-side depressions 160, the carrier substrate 100 is selectively thinned to a final thickness provided by the LED chips 191. Since this process is carried out on the carrier substrate 100 still having a relatively large thickness, there is no risk of the substrate 100 breaking, and the use of a stabilizing auxiliary substrate can therefore be dispensed with. In the case of the partly thinned carrier substrate 100 present after the process, the walls 161 extending between the depressions 160 can provide for corresponding stabilization. This benefits processes carried out after the formation of the depressions 160.

In order to realize the final thickness of the LED chips 191 with a high accuracy, the etching process for forming the depressions 160 is preferably carried out in a monitored manner. By way of example, an interferometric measurement can be carried out in order to measure the step height of that part of the carrier substrate 100 which is etched in the region of the depressions 160 relative to that part of the substrate 100 which is masked in the region of the walls 161. Given a known thickness of the carrier substrate 100, the erosion depth can be monitored in this way, such that the final thickness provided for the LED chips 191 can be set precisely. A further possibility is to carry out the etching process in a time-monitored manner. In this case, the time provided for achieving the final thickness is determined from the known thickness of the carrier substrate 100 and the known etching rate of the process, and the etching process is carried out on the basis of this. Carrying out the etching process in a monitored manner affords the possibility that LED chips 191 each having the same thickness can be produced despite a possible thickness fluctuation of different carrier substrates 100.

Figure 11:
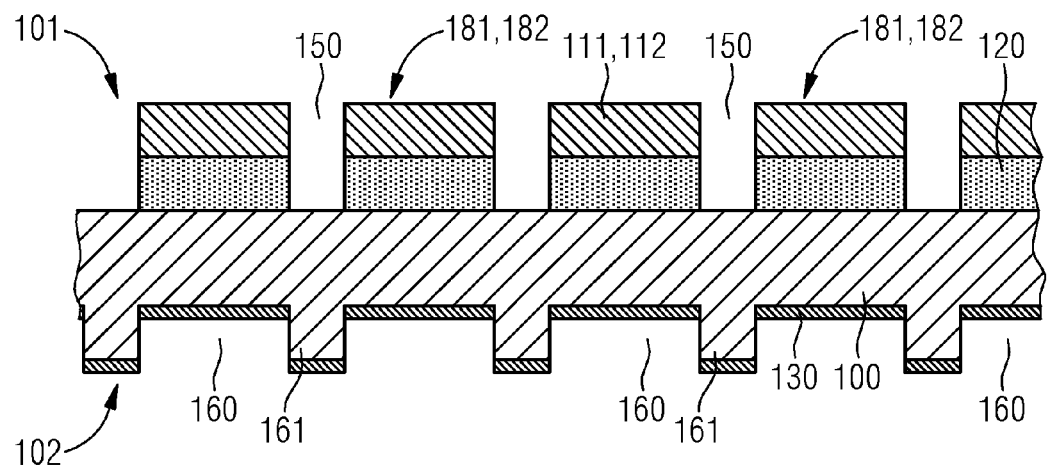
FIG. 11 shows the substrate with a metallic layer formed on the rear side.

After the etching of the rear-side depressions 160, in a further step 203 (cf. FIG. 17), a metallic layer 130 is formed on the patterned rear side 102 of the carrier substrate 100, as is shown in FIG. 11. This layer 130 is designated hereinafter as contact layer 130. Since the partly thinned carrier substrate 100 can still have a relatively high stability on account of the walls 161, this process can be carried out in a simple manner and without the risk of the substrate 100 breaking.

The contact layer 130, as shown in FIG. 11, is formed in sections in the region of the depressions 160 and on the walls 161 in the region of the ends thereof, such that side regions of the walls 161 are exposed. Sections of the contact layer 130 in the region of the depressions 160 can form rear-side contacts in the (subsequently singulated) LED chips 191. Such patterned application of the contact layer 130 is made possible by the presence of the patterned rear side 102 of the carrier substrate 100, and affords the advantage that a separating process for severing the contact layer 130 can be avoided. If appropriate, consideration can be given to applying the contact layer 130 in a directional manner in order to foster the section-by-section formation without coating the side regions of the walls 161.

The contact layer 130 can be formed as a layer stack—for example, comprising a metal/semiconductor contact layer, a metallurgical barrier, an adhesion layer, a wetting layer, a solder layer, a solder protection layer. Such a configuration can be provided for LED chips 191 in which the contact layer 130 is used as a rear-side contact for mechanical and electrical contact-making, and in which the front-side layer sections 181 are formed according to FIGS. 4 and 5. In a configuration of the layer sections 181 according to FIGS. 6 to 8, whereby the contact layer 130 is used only for producing mechanical connections, a different construction can be present for the contact layer 130 (for example, only in the form of an individual metal or solder layer).

In a subsequent step 204 (cf. FIG. 17), the carrier substrate 100 processed in this way is subdivided into individual LED chips 191. This can be carried out in various ways, as will be described below. It is pointed out that the features and details mentioned with regard to individual procedures from among those demonstrated can also apply to other procedures from among those described.

Figure 12:
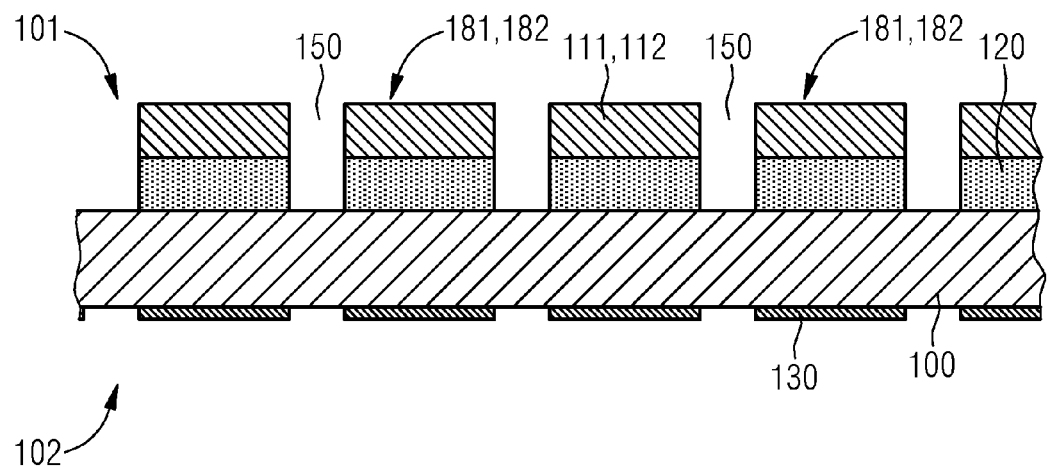
FIG. 12 shows the substrate after the walls have been removed.

By way of example, provision can be made, before the actual singulation, for (substantially) completely removing the walls 161 present between the depressions 160, as is shown in FIG. 12. For this purpose, by way of example, it is possible to carry out a wet-chemical etching process using an isotropically acting etching solution, wherein end point monitoring can be carried out in a suitable manner. In this case, the etching attack can be effected via the uncoated side areas of the walls 161, as a result of which the walls 161 together with that part of the contact layer 130 which is present at the end of the walls 161 can be "washed away." After the etching process, the contact layer 130 arranged at the rear side 102 of the carrier substrate 100 has a patterned form coordinated with the LED chips 191 to be produced.

Figure 13:
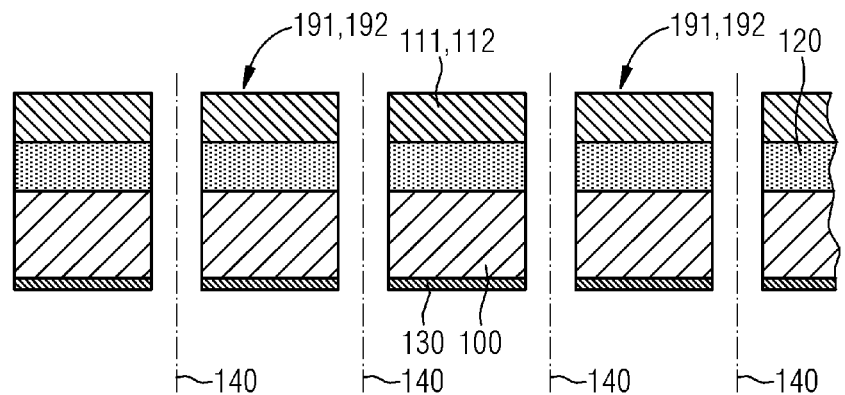
FIG. 13 shows semiconductor components that have emerged from the substrate as a result of a singulation.

After the removal of the walls 161, the carrier substrate 100 is severed in the separations regions 140 provided, as a result of which, as shown in FIG. 13, singulated LED chips 191 are produced. The severing is likewise effected with the aid of an anisotropic dry etching process, for example, a deep reactive ion etching process, as a result of which this process can be carried out relatively rapidly and reliably. For details concerning the deep reactive ion etching process as such, reference is made to the above explanations concerning FIG. 9 (forming the rear-side depressions 160), which can be applied analogously.

The carrier substrate 100 can be severed proceeding from the rear side 102 or proceeding from the front side 101. In the case of etching on the rear side, the carrier substrate 100 can be arranged with the front side 101 or with the layer sections 181 situated here on a customary separating film (not illustrated). In the etching process, the patterned contact layer 130 at the rear side 102 of the carrier substrate 100 can serve as an etching mask in order to form separating trenches or to remove substrate material in the separating regions 140, and thereby to singulate the LED chips 191. For separating etching or trench etching on the front side, by contrast, the carrier substrate 100 can be arranged with the rear side 102 on a separating film (not illustrated). As etching mask for the etching process, it is possible to use, for example, the mask (photoresist mask or hard mask) used for forming the front-side cutouts 150, which for this purpose is left on the useful layer 111 in order to remove substrate material in the separating regions 140.

Instead of removing the walls 161 before the actual singulation, the removal of the walls 161 and the severing of the carrier substrate 100 can be effected jointly. For this purpose, provision can be made, for example, for arranging the carrier substrate 100 in the method stage illustrated in FIG. 11 with the front side 101 or with the layer sections 181 situated here on a separating film, and performing etching from the rear side 102. In this case, a deep reactive ion etching process can be carried out in which firstly only the etching step is employed in order to etch the walls 161 and thereby also to remove that part of the contact layer 130 which is situated thereon. This can be followed by the customary cyclic process sequence with the alternation of etching and passivation steps, wherein the patterned contact layer 130 serves as an etching mask.

The jointly performed etching of the walls 161 and severing of the carrier substrate 100 affords the possibility of carrying out the production method relatively rapidly and with a relatively low outlay. By contrast, separately removing the walls 161 and subsequently severing the carrier substrate 100 makes it possible to ensure that the removal of the walls 161 cannot lead to impairment of the severing. For the etching of the walls 161 results in detachment of that part of the contact layer 130 which is situated thereon, which, in the event of depositing on the rear side 102 of the carrier substrate 100, may possibly cause a disturbance of the separating process.

Figure 14:
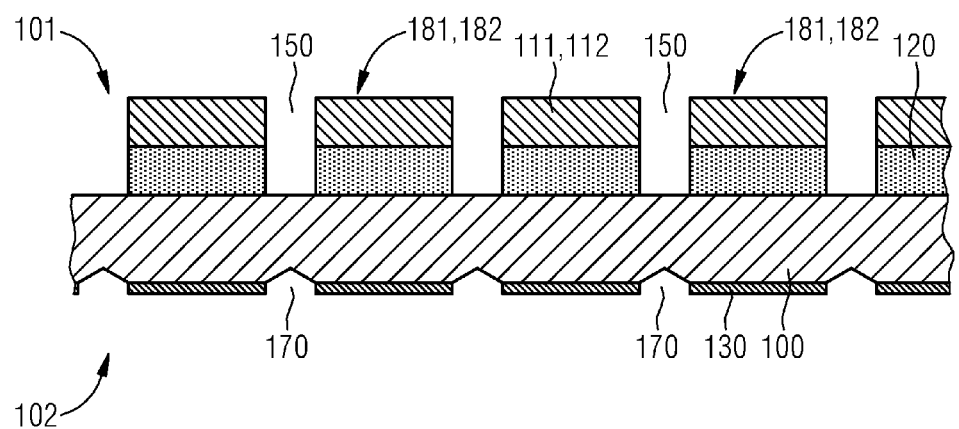
FIG. 14 shows a further illustration of the substrate after removal of the walls, wherein V-shaped etching regions are present at the rear side.

Instead of an isotropic etching solution, an anisotropically acting etching solution can be used for the separate removal of the walls 161. In this case, too, the etching attack can be effected via the uncoated side regions of the walls 161, as a result of which the walls 161 together with that part of the contact layer 130 which is present at the end of the walls 161 can be "washed away." The use of an anisotropic etching solution has the consequence that, after the "washing away" of the walls 161, as shown in FIG. 14, V-shaped etching regions 170 can be present at the rear side 102 of the carrier substrate 100 in the region of the separating regions 140. Compared with isotropic etching, the anisotropic etching of the walls 161 affords the possibility of reliably avoiding (appreciable) undercutting of the rear-side contact layer 130. The carrier substrate 100 can subsequently be severed in the manner described above by etching from the front or rear side 101, 102.

Figure 15:
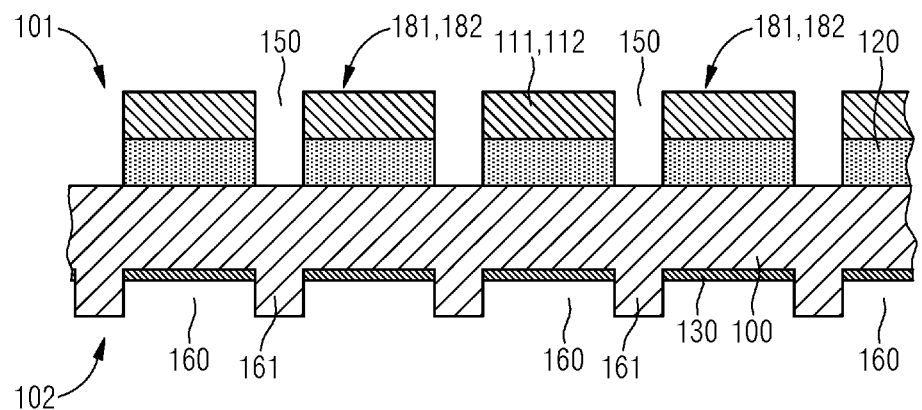
FIG. 15 shows a further illustration of the substrate, wherein the metallic layer has been removed from the walls.

FIG. 15 illustrates a further variant, according to which, after the contact layer 130 has been applied to the rear side 102 of the carrier substrate 100, that part of the contact layer 130 which is situated on the walls 161 at the end is removed. This makes it possible to avoid impairment of a subsequent process by a metal mask present in this region. The local removal of the contact layer 130 from the walls 161 can be carried out, for example, with the aid of a lift-off process. For this purpose, the etching mask used in the context of the compartmentalized thinning process, i.e., the etching process for forming the depressions 160, which etching mask is preferably present in the form of a photoresist mask for use as a lift-off mask and masks the substrate 100 in the region of the walls 161, is not removed, and so the contact layer 130 is formed thereon. By dissolving the etching mask, which can be effected using a solvent in a configuration in the form of a photoresist mask, it is possible for the contact layer 130 to be lifted off from the walls 161.

Afterward, provision can be made for separately removing the walls 161 in the manner described above, and subsequently severing the carrier substrate 100 from the front or rear side 101, 102. Alternatively, the removal of the walls 161 and the severing of the substrate 100 can be effected jointly by a deep reactive ion etching process, as described above, wherein firstly only etching is performed in order to remove the walls 161, and subsequently cyclic etching and passivation is carried out in order to sever the substrate 100.

In a further embodiment, separate removal of the walls 161 is not carried out by etching, but rather with the aid of a polishing or grinding process. That part of the contact layer 130 which is situated on the walls 161 can be concomitantly removed during polishing. The polishing or grinding can be carried out in such a way that after this process, in a departure from FIG. 12, the carrier substrate 100, at the rear side 102 in each case in the region between the residual sections of the contact layer 130, is (substantially) flush with the sections of the contact layer 130. The carrier substrate 100 can subsequently be severed by etching from the front or rear side 101, 102 in the manner described above.

Figure 16:
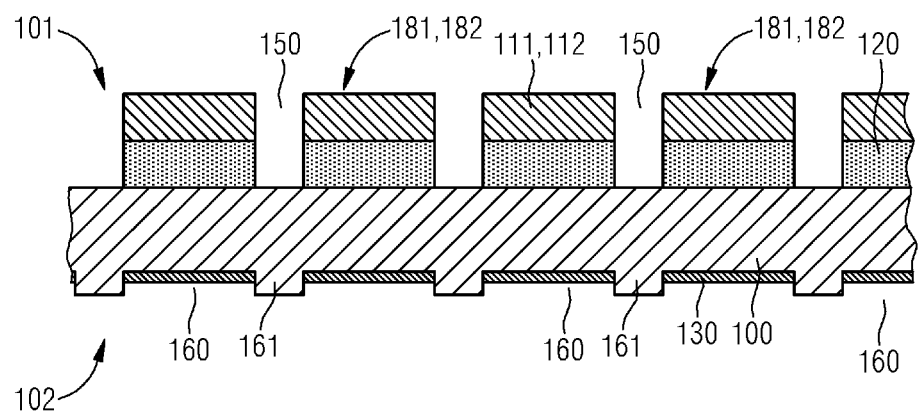
FIG. 16 shows a further illustration of the substrate, wherein the walls have been partly eroded.
Figure 17:
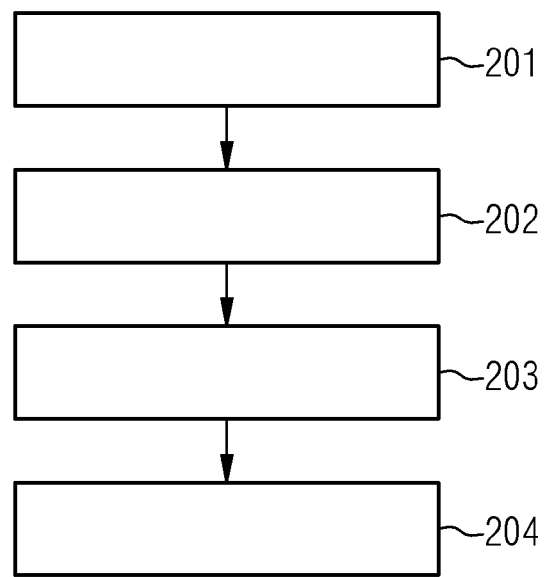
FIG. 17 shows a flow chart for elucidating steps of a method for producing singulated semiconductor components.

It is also possible for the walls 161, as shown in FIG. 16, to be only partly removed or eroded, which can likewise be effected with the aid of a polishing or grinding process. In this way, the walls 161 can be prepared, for example, for subsequent faster etching, isotropic or anisotropic. Partial removal of the walls 161 can furthermore be utilized in order to foster joint removal of the walls 161 (i.e., of the remaining part of the wall 161) and severing of the substrate 100 that are subsequently carried out from the rear side 102. In this way, it is also possible to remove that part of the contact layer 130 which is situated (previously) on the walls 161, and to avoid impairment possibly emerging from this. Furthermore, consideration may be given to carrying out partial removal of the walls 161 by etching, rather than by polishing.

The LED chips 191 produced with the aid of the method can have a relatively high stability. This is owing to the fact that the singulation is carried out on the basis of etching processes, as a result of which it is possible to avoid mechanical damage to the LED chips 191 (i.e., the semiconductor material or crystal of the associated carrier substrate 100). This circumstance and also the procedure of forming depressions 160 in the carrier substrate 100 and carrying out the actual severing in separating regions 140 between the depressions 160 (instead of the conventional procedure of thinning a substrate over the whole area at one side and subsequently severing it) afford the possibility of reliably avoiding breaking of the substrate and thus losses of yield.

If appropriate, it may be suitable, in the context of the etching of the depressions 160 (step 202, FIG. 9), also to mask the edge or wafer edge of the carrier substrate 100 and thereby leave it intact (not illustrated). As a result, the partly thinned carrier substrate 100 may possibly have an even higher stability. The wafer edge that has remained can be connected to the walls 161 or merge into the walls 161. Furthermore, the edge can be coated with the contact layer 130 in step 203 in a manner corresponding to the walls 161, and can be etched or eroded in step 204 like the walls 161. For details in this respect which can be applied analogously, reference is made to the above explanations.

A further advantage of the method is that the LED chips 191 can be produced with a relatively small thickness of the carrier substrate 100. This results in the presence of a low thermal resistance between the electronically or optoelectronically used layer section 181 on the front side and the opposite rear side 102. In this way, the LED chips 191 can be operated with higher power for the same efficiency in comparison with thicker components.

After singulation, the LED chips 191 can be processed further or installed, and for example, can be arranged on a carrier or a circuit board, potted and/or accommodated in a housing. The metallic contact layer 130 at the rear side of the LED chips 191 can serve as a rear-side contact in order to electrically and mechanically connect the LED chips 191 to corresponding mating contacts. It is also possible for the contact layer 130 to be used only for mechanically fixing the LED chips 191 at corresponding mounting positions. In both configurations, it is possible to produce a connection by soldering. Furthermore, bonding wires, for example, can be connected to front-side contacts 115, 116 of the LED chips 191 (cf. FIGS. 4 to 8). During operation, a current flow through the LED chips 191 or through the useful layers 111 thereof can be brought about via the respective contacts, as a result of which a light radiation can be emitted.

The method and its embodiments described with reference to the figures are not just restricted to the production of light emitting diodes or LED chips 191, but rather can also be used for producing other components. One possible example is the production of concentrator solar cells 192, which is described below likewise with reference to FIGS. 1 to 17. In this case, it is pointed out that with regard to details already described which relate to identical or corresponding components and features, possible advantages, etc., reference is made to the above explanations. Concentrator solar cells 192 are usually combined with optical concentrators (for example, lenses) in order to concentrate sunlight incident on a larger area onto the solar cells 192 (not illustrated).

In the method, a step 201 (cf. FIG. 17) involves providing a carrier substrate 100, at the front side 101 of which a layer arrangement for the solar cells 192 to be produced is arranged. The carrier substrate 100 comprises a (doped) semiconductor material, for example, silicon or germanium. The layer arrangement substantially comprises a useful layer 112 produced by thin-film technology and an intermediate layer 120 (cf. FIG. 1). The useful layer 112 and the intermediate layer 120 are constructed from a plurality of (if appropriately patterned) partial layers (not illustrated).

The useful layer 112 comprises a semiconductor layer sequence which is grown on an epitaxy substrate (not illustrated) with the aid of an epitaxy method and is transferred to the carrier substrate 100. The semiconductor layer sequence, with the aid of which an electromagnetic radiation (sunlight) can be converted into electrical energy, is a triple cell layer, for example, which is produced by inverted metamorphic crystal growth on an epitaxy substrate composed of GaAs.

For the layer transfer, it is possible to form one or more metallic connecting layers on the thin-film useful layer 112 and/or on the carrier substrate 100 (and also, if appropriate, further layers). Furthermore, a bonding method is carried out in order to arrange the coated epitaxy substrate on the carrier substrate 100. In the context of the bonding method, by way of example, the connecting layers can be melted, such that they form a common connecting layer comprised by the intermediate layer 120 shown in the figures. The epitaxy substrate is subsequently removed from the useful layer 112. With the use of an epitaxy substrate composed of GaAs, wet-chemical etching of the epitaxy substrate can be carried out, for example.

In the context of step 201 (cf. FIG. 17), the layer arrangement comprising useful layer 112 and intermediate layer 120 that is present at the front side 101 of the carrier substrate 100 is furthermore patterned. For this purpose, firstly, as shown in FIG. 1, the useful layer 112 is subdivided into individual sections associated with the solar cells 192 to be produced. This can be effected (not illustrated), for example, by dry or plasma etching using an etching mask formed on the useful layer 112, for example, a photoresist mask or a hard mask. The sections of the useful layer 112 are separated from one another by cutouts 150 which form a continuous cutout structure or trench structure (cf. FIG. 3) and which are arranged in the region of separating regions 140 provided for severing the carrier substrate 100.

Furthermore, as shown in FIG. 2, the intermediate layer 120 is removed in the separating regions 140, as a result of which the cutouts 150 extend as far as the carrier substrate 100. This can be effected by wet-chemical etching, for example. After the intermediate layer 120 has been patterned, individual layer sections 182 formed from the useful layer 112 and the intermediate layer 120 and surrounded by the cutouts 150 are present on the carrier substrate 100. The layer sections 182 are situated in the region of the concentrator solar cells 192 to be produced and can be regarded as prepatterned solar cells.

The solar cells 192 can be embodied with a shape which deviates from a conventional rectangular or square shape. In the present case, the production of hexagonal solar cells 192 is provided in order to achieve better area utilization. The layer sections 182 are already produced with a hexagonal shape, as becomes clear from the front side 101 of the carrier substrate 100 as shown in the plan view in FIG. 3. The structure comprising the layer sections 182 and the enclosing cutouts 150 is similar to a honeycomb pattern.

The layer sections 182 are furthermore formed with front-side contacts, which can be effected, for example, before the patterning of the layer arrangement 112, 120 into the layer sections 182, or else, for example, in the context of patterning, i.e., after the patterning of the useful layer 112 and before the patterning of the intermediate layer 120. The different configurations shown in FIGS. 4 to 8 can be taken into consideration for the layer sections 182.

The layer section 182 shown in FIG. 4 has a front-side contact 115 arranged on the front side on the useful layer 112, which front-side contact can be formed, for example, for making contact by means of wire bonding, and in a multilayered fashion, for example. By means of the front-side contact 115, it is possible to make contact with the useful layer 112 (or a front-side partial layer thereof) from the front side. Contact can be made with the rear side of the useful layer 112 (or a rear-side partial layer) in the later solar cell 192 via a rear-side contact arranged on the carrier substrate 100, the carrier substrate 100 and the intermediate layer 120 (cf. FIG. 13 with the layer 130 serving as a rear-side contact). In a further configuration, linear contact structures connected to the contact 115 can be arranged on the useful layer 112, and the contact 115 can be arranged at the edge of the useful layer 112 (not illustrated).

In the case of the layer section 182 shown in FIG. 5, a front-side contact 116 is arranged on the intermediate layer 120 laterally with respect to the useful layer 112, as a result of which shading of the useful layer 112 is avoided. The front-side contact 116 can be formed, for example, for making contact by means of wire bonding, and in a multilayered fashion, for example. The front-side contact 116 can furthermore be electrically connected to the rear side of the useful layer 112 (or to a rear-side partial layer) for example, via a conductive structure of the intermediate layer 120. For making contact with the front side of the useful layer 112 (or a front-side partial layer), the intermediate layer 120 can have (not illustrated) one or more through-contacts partly penetrating through the useful layer 112. As a result, in the associated solar cell 192, contact can be made with the front side of the useful layer 112 (or the front-side partial layer) via a rear-side contact, the carrier substrate 100 and the intermediate layer 120 (cf. FIG. 13 with the layer 113). Alternatively, an opposite configuration is conceivable, according to which the front-side contact 116 is connected to the front side of the useful layer 112 (or the front-side partial layer) and the rear-side contact is connected to the rear side of the useful layer 112 (or to the rear-side partial layer).

FIG. 6 shows a further variant, wherein two front-side contacts 116 provided for wire bonding, for example, are arranged on the intermediate layer 120 laterally with respect to the useful layer 112. The layer section 182 therefore has in each case a stepped shape in the region of the two contacts 116. One front-side contact 116 is electrically connected to the front side of the useful layer 112 (or to a front-side partial layer), and the other front-side contact 116 is connected to the rear side of the useful layer 112 (or to a rear-side partial layer). For this purpose, the intermediate layer 120 is formed (not illustrated) with corresponding conductive structures and with one or more through-contacts partly penetrating through the useful layer 112.

FIG. 7 shows a further configuration of a layer section 182, wherein two front-side contacts 115 provided for wire bonding, for example, are arranged on the useful layer 112. The useful layer 112 has a stepped shape, such that a rear-side partial layer of the useful layer 112 is accessible at the edge thereof (right-hand side of the useful layer 112 in FIG. 7). In this region, one front-side contact 115 is arranged on the rear-side partial layer. The other front-side contact 115 (on the left in FIG. 7) is arranged, by contrast, on a front-side partial layer of the useful layer 112.

FIG. 8 shows a further configuration of a layer section 182, wherein two front-side contacts 115 are arranged on the useful layer 112. One front-side contact 115 (on the left in FIG. 8) is electrically connected to a front-side partial layer of the useful layer 112. The other front-side contact 115 (on the right in FIG. 8) is connected to a rear-side partial layer of the useful layer 112 via a through-contact 117.

In the embodiments in FIGS. 6, 7 and 8, a metallic layer (cf. FIG. 13 with the layer 130) present on the rear side on the carrier substrate 100 in the associated solar cell 192 can be used only for producing a mechanical contact. Furthermore, provision can be made for the intermediate layer 120 to comprise an electrical insulation layer, whereby the useful layer 112 can in each case be electrically insulated from the carrier substrate 100.

The carrier substrate 100 with the front-side layer sections 182 formed according to FIG. 4, 5, 6, 7 or 8 is subsequently subjected to a step 202 (cf. FIG. 17) in which the front-side honeycomb pattern is transferred to a rear side 102 of the carrier substrate 100, said rear side being opposite the front side 101. In this case, as shown in FIG. 9, depressions 160 are formed at the rear side 102, said depressions being separated from one another by thin web-shaped walls 161. The depressions 160 are in each case situated below the layer sections 182 and like the layer sections 182 are arranged in the region of the solar cells 192 to be produced. With regard to the hexagonal solar cells 192, the depressions 160, as is shown in the plan view illustration of the rear side 102 in FIG. 10, are formed with a hexagonal shape. The walls 161 surrounding the depressions 160 form a continuous wall structure, and are arranged below the front-side cutouts 150 and, therefore, in the region of the separating regions 140.

The formation of the depressions 160 and honeycomb walls 161 is carried out with the aid of an anisotropic dry etching process using an etching mask formed on the rear side 102, for example, a patterned photoresist layer or a patterned hard mask layer (not illustrated). In this case, the depressions 160 are etched into the rear side 102 of the carrier substrate 100, whereas masked substrate material remains in the form of the walls 161. For etching, a deep reactive ion etching process is preferably carried out, in which an etching step and a passivation step alternate in succession. In this case, by way of example, it is possible to have recourse to the formulations of the Bosch process. In the deep ion etching process, a plasma is furthermore generated, for example, by inductive coupling.

As a result of the formation of the depressions 160, the carrier substrate 100 is selectively thinned to a final thickness provided for the solar cells 192. On account of the walls 161, the partly thinned substrate 100 can still have a relatively high stability. In order to realize the final thickness with a high accuracy, the dry etching process is preferably carried out in a monitored manner. This can be effected, for example, by employing an interferometric measurement, or by carrying out the etching process in a time-monitored manner.

Afterward, in a further step 203 (cf. FIG. 17), a metallic layer 130, designated hereinafter as contact layer 130, is formed on the patterned rear side 102 of the carrier substrate 100. The contact layer 130, as shown in FIG. 11, is formed in sections in the region of the depressions 160 and on the walls 161 in the region of the ends thereof, such that side regions of the walls 161 are exposed. Sections of the contact layer 130 in the region of the depressions 160 can form rear-side contacts in the (subsequently singulated) solar cells 192. In order to produce the (patterned) contact layer 130, gold, for example, can be vapor-deposited in a directional manner.

In a subsequent step 204 (cf. FIG. 17), the carrier substrate 100 processed in this way is subdivided into individual solar cells 192. This can be done in various ways.

By way of example, consideration can be given to removing the rear-side walls 161 before the actual singulation, as is shown in FIG. 12. For this purpose, a wet-chemical etching process using an isotropically acting etching solution can be carried out in order to "wash away" the walls 161 uncoated at the sides together with that part of the contact layer 130 which is arranged thereon at the end. An anisotropic dry etching process, preferably a deep reactive ion etching process, is then carried out in order to remove substrate material in the separating regions 140, and thereby to singulate the solar cells 192. The carrier substrate 100 can be severed proceeding from the rear side 102, wherein for this purpose the carrier substrate 100 is arranged with the front side 101 or with the layer sections 182 on a separating film and the patterned contact layer 130 serves as an etching mask. Alternatively, the etching can be effected proceeding from the front side 101, wherein for this purpose the carrier substrate 100 is arranged with the rear side 102 on a separating film, and the etching mask which has already been used for forming the front-side cutouts 150 (and has remained on the useful layer 112) is used.

Alternatively, the removal of the walls 161 and the severing of the carrier substrate 100 can be effected jointly. In this case, in the method stage illustrated in FIG. 11, the carrier substrate 100 can be arranged, for example, with the front side 101 or with the layer sections 182 on a separating film and etching can be effected from the rear side 102. For etching purposes it is possible to use a deep reactive ion etching process, wherein firstly only etching is effected and, after the removal of the walls 161, etching and passivation are effected alternately.

For the separate removal of the walls 161 (before the severing of the substrate 100), it is also possible to use an anisotropically acting etching solution. In this way, after the "washing away" of the walls 161, as shown in FIG. 14, V-shaped etching regions 170 can be present at the rear side 102 of the carrier substrate 100 in the region of the separating regions 140.

Furthermore, it is possible to remove that part of the contact layer 130 which is situated on the walls 161 at the end, as shown in FIG. 15. This can be done by means of a lift-off process, for example, wherein the etching or photoresist mask used for forming the depressions 160 is used as a lift-off mask. This can be followed by processes described above (removal of the walls 161 and severing of the substrate 100, carried out separately or jointly).

Separate removal of the walls 161, including that part of the contact layer 130 which is situated thereon, which is carried out before the severing of the substrate can also be effected with the aid of a polishing or grinding process. Polishing can furthermore be carried out for the purpose of only partly removing the walls 161, as shown in FIG. 16. As a result, the walls 161 can be prepared, for example, for subsequent faster etching. Furthermore, consideration can be given to carrying out partial removal of the walls 161 by etching rather than by polishing.

Since the singulation is carried out on the basis of anisotropic etching processes, the solar cells 192 produced can have a relatively high stability. Moreover, the method can be carried out without the risk of the substrate breaking, and thus without losses of yield. A further advantage is that the solar cells 192 can be produced with a relatively small thickness of the carrier substrate 100. In this way, improved heat dissipation from the layer section 182 arranged in the region of the front side, said layer section being irradiated with solar radiation concentrated thereon during operation, to the rear side can be made possible for the solar cells 192.

During the production of the solar cells 192, provision can also be made, in the context of etching the depressions 160 (step 202, FIG. 9), for masking the wafer edge of the carrier substrate 100 and thereby leaving it intact (not illustrated). As a result, the partly thinned carrier substrate 100 can, if appropriate, have an even higher stability. The wafer edge that has remained can be connected to the walls 161 or merge into the walls 161. The edge can furthermore be coated with the contact layer 130 in a manner corresponding to the walls 161 in step 203 and can be etched or eroded like the walls 161 in step 204.

After singulation, the solar cells 192 can be processed further or installed, and can be arranged, for example, on a carrier or a circuit board. The rear-side contact layer 130 can serve as a rear-side contact in order to electrically and mechanically connect the solar cells 192 to corresponding mating contacts. Alternatively, the layer 130 can be used only for mechanically fixing the solar cells 192. A connection can be produced in each case by soldering. Furthermore, bonding wires, for example, can be connected to front-side contacts 115, 116 of the solar cells 192 (cf. FIGS. 4 to 8). During the operation of the solar cells 192, a current generated photovoltaically in the useful layer 182 can be tapped off via the respective contacts.

The embodiments explained with reference to the figures constitute preferred or exemplary embodiments of the invention. Further embodiments which can comprise further modifications or combinations of features are conceivable besides the embodiments described and illustrated. By way of example, other materials can be used instead of the materials indicated above, in particular for constituents and layers of the components 191, 192 to be produced, and for etching constituents.

Furthermore, other or additional processes can be carried out, and/or other or additional structures and layers can be formed. One example considered is forming a protective passivation layer on the patterned sections of the useful layer 111, 112 or on the layer sections 181, 182. Furthermore, provision can be made for carrying out other anisotropic dry etching processes, in which, for example, only (for example, fluorine-based) plasma etching is effected without cyclic passivation.

Instead of bonding methods in which metallic connecting layers are melted, it is possible to carry out alternative bonding or joining methods in which adhesives, for example, are employed. It is also possible to connect metallic connecting layers by means of thermocompression.

Modifications are also conceivable for the configurations of layer sections 181, 182 described with reference to FIGS. 4 to 8. By way of example, the embodiment in FIG. 5 can be modified to the effect that a further front-side contact 115 is provided directly on the useful layer 111, 112. Said further front-side contact can make contact with a front-side partial layer of the useful layer 111, 112, for example, whereas the other contact 116 is connected to a rear-side partial layer of the useful layer 111, 112.

A further possible modification consists in carrying out process steps in a different order, if appropriate. By way of example, provision can be made for carrying out the patterning of the front-side layer arrangement 111, 120 or 112, 120 into the separate layer sections 181, 182 only after the etching of the depressions 160, such that firstly the rear-side honeycomb pattern is produced, and is transferred to the front side. In this configuration, too, the relatively high stability of the partly thinned substrate 100 that is made possible by the honeycomb walls 161 can prove to be advantageous.

With regard to the metallic contact layer 130, it is conceivable for this layer 130, in a departure from FIG. 11, to be applied to the rear side 102 of the carrier substrate 100 as a continuous layer 130, and for side regions of the walls 161 also to be covered as a result. In this configuration, provision can be made for eroding the walls 161 including the layer 130 situated thereon by means of a polishing or grinding process, as a result of which the layer 130 is removed in the region of the separating regions 140, and, as a result, the layer 130 has a patterned form having sections in the region of the components to be produced. Afterward, in the manner described above, the carrier substrate 100 can be severed by an anisotropic dry etching process from the front or rear side.

Furthermore, the possibility is afforded of forming components not just with a hexagonal shape, but also with other (lateral) shapes. These include not only conventional rectangular or square shapes, but also round shapes, for example. It is furthermore possible to form components having a rear-side metallic layer 130, wherein the metallic layer 130 has rounded edges (in plan view). This can be achieved by means of a corresponding configuration of the rear-side cutouts 160.

It is furthermore pointed out that the method and the different embodiments thereof can also be used for producing singulated semiconductor components other than LED chips 191 and thin-film or concentrator solar cells 192. One possible example is laser diodes. For such (or else other) components, it may furthermore be appropriate for a carrier substrate to comprise a different semiconductor material instead of silicon or germanium. One possible example is a carrier substrate composed of GaAs. A chlorine-based dry or deep ion etching process, for example, can be carried out for the etching of such a carrier substrate.

The use of a GaAs carrier substrate can be provided for the laser diodes mentioned above, but also for concentrator solar cells, for example. In this regard, it is conceivable for a layer arrangement suitable for such components to be produced on an epitaxy substrate composed of GaAs. The epitaxy substrate can simultaneously serve as a carrier substrate for the laser diodes or concentrator solar cells, such that, in a departure from the description above, no layer transfer is carried out. The layer arrangement can be patterned in a corresponding manner into individual layer sections associated with the later laser diodes or solar cells. For the purpose of singulation, provision can be made for forming rear-side depressions in the region of the later laser diodes or solar cells, coating the carrier substrate with a rear-side metallic layer, and severing it in separating regions (between the depressions).

Furthermore, it is also possible to produce other singulated components with the aid of the method. In the same way, here as well a starting substrate can be provided, provided with rear-side depressions in the region of the components, coated with a rear-side metallic layer, and severed in separating regions (between the depressions). Here, as well the substrate, can comprise a (patterned) layer arrangement on the front side. It is furthermore possible for the front side of the starting or carrier substrate to be formed with, for example, electrical structures, electronic structures, circuit structures and/or front-side contacts. Such a configuration can be provided, for example, for the production of silicon components, for example, of integrated circuits.

Although the invention has been illustrated and described more closely in detail by possible or preferred exemplary embodiments, the invention is not restricted by the examples disclosed and other variations can be derived therefrom by a person skilled in the art, without departing from the scope of protection of the invention.

The invention claimed is:

1. A method for producing singulated semiconductor components, the method comprising:
    providing a starting substrate, wherein the starting substrate comprises a carrier substrate and a layer arrangement arranged at a first side of the carrier substrate;
    forming depressions by a first etch process at a second side of the starting substrate, wherein the second side is opposite the first side, wherein the depressions are arranged in regions of semiconductor components and walls are present between the depressions in regions of separating regions between the semiconductor components;
    forming a metallic layer on the second side of the starting substrate with the depressions and walls; and
    separating by a second etch process the starting substrate in the separating regions thereby forming the singulated semiconductor components.

2. The method according to claim 1, wherein the semiconductor components comprise luminescence diodes.

3. The method according to claim 1, wherein the semiconductor components comprise concentrator solar cells.

4. The method according to claim 1, further comprising patterning the layer arrangement into individual layer sections, wherein the layer sections are arranged in the regions of the semiconductor components, and wherein cutouts are present between the layer sections in the regions of the separating regions.

5. The method according to claim 1, wherein the metallic layer is formed in such a way that side regions of the walls are exposed.

6. The method according to claim 1, further comprising at least partly removing the walls present between the depressions.

7. The method according to claim 6, wherein at least partly removing the walls comprises etching the walls with a further etching process.

8. The method according to claim 6, wherein at least partly removing the walls comprises polishing the walls with a polishing process.

9. The method according to claim 1, further comprising removing a part of the metallic layer that is formed on the walls.

10. The method according to claim 1, wherein the depressions have a hexagonal shape.

11. The method according to claim 1, wherein the first etching process for forming the depressions and the second etching process for severing the starting substrate in each case comprise anisotropic dry etching.

12. The method according to claim 1, further comprising monitoring the first etching process for forming the depressions with an interferometric measurement.

13. The method according to claim 1, further comprising time-monitoring the first etching process for forming the depressions.

* * * * *

UNITED STATES PATENT AND TRADEMARK OFFICE
CERTIFICATE OF CORRECTION

| | | |
|---|---|---|
| PATENT NO. | : 8,969,175 B2 | Page 1 of 1 |
| APPLICATION NO. | : 13/974991 | |
| DATED | : March 3, 2015 | |
| INVENTOR(S) | : Andreas Ploessl et al. | |

It is certified that error appears in the above-identified patent and that said Letters Patent is hereby corrected as shown below:

On the Title Page, Item 73 Assignee, line 2, delete "Regensberg (DE)" and insert --Regensburg (DE)--

Signed and Sealed this
Twenty-ninth Day of December, 2015

Michelle K. Lee
*Director of the United States Patent and Trademark Office*